(12) United States Patent
Onodera

(10) Patent No.: US 10,952,310 B2
(45) Date of Patent: Mar. 16, 2021

(54) HIGH-FREQUENCY MODULE

(71) Applicant: Murata Manufacturing Co., Ltd., Kyoto (JP)

(72) Inventor: Syuichi Onodera, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/374,194

(22) Filed: Apr. 3, 2019

(65) Prior Publication Data

US 2019/0230781 A1    Jul. 25, 2019

Related U.S. Application Data

(63) Continuation of application No. PCT/JP2017/038370, filed on Oct. 24, 2017.

(30) Foreign Application Priority Data

Nov. 16, 2016   (JP) .............................. JP2016-223455

(51) Int. Cl.
  *H05K 1/02*   (2006.01)
  *H05K 1/16*   (2006.01)
  (Continued)

(52) U.S. Cl.
  CPC .......... *H05K 1/0203* (2013.01); *H01L 23/00* (2013.01); *H01L 23/02* (2013.01); *H01L 23/28* (2013.01);
  (Continued)

(58) Field of Classification Search
  CPC ... H01L 2924/181; H01L 23/34; H01L 23/28; H01L 23/02; H01L 23/00;
  (Continued)

(56) References Cited

U.S. PATENT DOCUMENTS

2003/0169575 A1*  9/2003  Ikuta ................... H01L 23/3677
                                                  361/761
2006/0049995 A1*  3/2006  Imaoka ..................... H01Q 1/22
                                                  343/702
(Continued)

FOREIGN PATENT DOCUMENTS

JP      2007-67407 A      3/2007
JP      2008-305937 A     12/2008
(Continued)

OTHER PUBLICATIONS

International Search Report for International Application No. PCT/JP2017/038370.
(Continued)

*Primary Examiner* — Adam B Dravininkas
(74) *Attorney, Agent, or Firm* — Pearne & Gordon LLP

(57) ABSTRACT

A high-frequency module (1) includes a substrate (10), a first electronic component (13) and a second electronic component (14) that are provided on the substrate (10), an insulating layer (15) that covers a part of a side surface of the first electronic component (13) and a side surface and a top surface of the second electronic component (14), and a heat-dissipating layer (16) that covers at least a top surface of the first electronic component (13) and a portion of the side surface of the first electronic component (13) excluding the portion of the side surface of the first electronic component (13) in contact with the insulating layer (15).

16 Claims, 2 Drawing Sheets

(51) Int. Cl.
*H05K 1/18* (2006.01)
*H01L 23/28* (2006.01)
*H05K 9/00* (2006.01)
*H01L 23/02* (2006.01)
*H01L 23/00* (2006.01)
*H01L 23/34* (2006.01)
*H05K 3/28* (2006.01)

(52) U.S. Cl.
CPC .............. *H01L 23/34* (2013.01); *H05K 1/162* (2013.01); *H05K 1/165* (2013.01); *H05K 1/186* (2013.01); *H05K 9/00* (2013.01); *H01L 2224/16225* (2013.01); *H05K 1/0209* (2013.01); *H05K 1/181* (2013.01); *H05K 3/284* (2013.01); *H05K 2203/1322* (2013.01)

(58) Field of Classification Search
CPC .......... H01L 2224/16225; H05K 3/284; H05K 1/181; H05K 1/162; H05K 1/165; H05K 1/0218; H05K 1/0243; H05K 2201/086; H05K 1/0203; H05K 1/186; H05K 9/00; H05K 3/46; H05K 1/02
See application file for complete search history.

(56) References Cited

U.S. PATENT DOCUMENTS

| | | | |
|---|---|---|---|
| 2007/0045829 A1 | 3/2007 | Jeong et al. | |
| 2007/0056829 A1* | 3/2007 | Rice | H01L 21/6773 198/465.4 |
| 2008/0304237 A1 | 12/2008 | Shiraishi | |
| 2008/0315396 A1* | 12/2008 | Kuhlman | H01L 23/3121 257/692 |
| 2008/0315404 A1* | 12/2008 | Eichelberger | H01L 21/6835 257/713 |
| 2009/0170242 A1* | 7/2009 | Lin | H01L 21/6835 438/107 |
| 2010/0172116 A1* | 7/2010 | Yorita | H01L 21/565 361/816 |
| 2010/0182755 A1* | 7/2010 | Maejima | H01L 23/49838 361/748 |
| 2010/0207264 A1* | 8/2010 | Ono | H01L 21/561 257/690 |
| 2011/0248389 A1* | 10/2011 | Yorita | H01L 25/0652 257/659 |
| 2012/0187551 A1* | 7/2012 | Kushino | H01L 24/97 257/659 |
| 2013/0337610 A1* | 12/2013 | Oda | H01L 21/50 438/113 |
| 2015/0163958 A1* | 6/2015 | Oguma | H05K 7/20463 264/36.22 |
| 2016/0037640 A1* | 2/2016 | Takai | H01L 23/3107 361/753 |
| 2017/0141066 A1* | 5/2017 | Toyota | H03H 9/059 |

FOREIGN PATENT DOCUMENTS

| | | | |
|---|---|---|---|
| JP | 2010-192653 A | 9/2010 | |
| JP | 2012-182350 A | 9/2012 | |
| JP | 2012182350 A * | 9/2012 | ............ H01L 24/97 |
| JP | 2014-27249 A | 2/2014 | |
| WO | 2013/035819 A1 | 3/2013 | |

OTHER PUBLICATIONS

Written Opinion for International Application No. PCT/JP2017/038370.

* cited by examiner

HIGH-FREQUENCY MODULE

This is a continuation of International Application No. PCT/JP2017/038370 filed on Oct. 24, 2017 which claims priority from Japanese Patent Application No. 2016-223455 filed on Nov. 16, 2016. The contents of these applications are incorporated herein by reference in their entireties.

BACKGROUND OF THE DISCLOSURE

Field of the Disclosure

The present disclosure relates to a high-frequency module.

Description of the Related Art

Hitherto, as a high-frequency module, an electronic component built-in module in which electronic components, such as inductors and capacitors, and heat-generating components, such as power amplifiers and duplexers, are mounted on the same substrate and are sealed has been developed (refer to, for example, Patent Document 1).

In the component built-in module that is described in Patent Document 1, the electronic components mounted on the wires formed on the substrate are sealed by an insulating layer, and a heat sink is provided on the insulating layer. Therefore, the heat that is generated from the electronic components and wiring layers is conducted to the heat sink from the insulating layer and is dissipated.

Patent Document 1: Japanese Unexamined Patent Application Publication No. 2008-305937

BRIEF SUMMARY OF THE DISCLOSURE

In a high-frequency module according to the related art, since an inorganic filler is added to an insulating layer, the insulating layer has excellent thermal conductibility. However, in general, insulating layers having excellent thermal conductibility are hard, but have low resistance to physical impact (low physical impact resistance). Therefore, insulating layers having excellent thermal conductibility (heat dissipation) tend to peel from the substrate, and the electronic components mounted on the substrate peel from the substrate due to the peeling of the insulating layers.

In view of the above-described problems, it is an object of the present disclosure to provide a high-frequency module that improves the heat dissipation and that suppresses the peeling of an electronic component from a substrate.

To this end, the present disclosure provides a high-frequency module including a substrate, a first electronic component and a second electronic component that are provided on the substrate, an insulating layer that covers a part of a side surface of the first electronic component and a side surface and a top surface of the second electronic component, and a heat-dissipating layer that covers at least a top surface of the first electronic component and a portion of the side surface excluding the part of the side surface of the first electronic component.

Therefore, since the part of the side surface of the first electronic component and the side surface and the top surface of the second electronic component are covered by the insulating layer, it is possible to suppress the peeling of the first electronic component and the second electronic component from the substrate. The portion of the side surface and the entire top surface of the first electronic component are not covered by the insulating layer but are covered by the heat-dissipating layer. Since the contact area between the first electronic component and the heat-dissipating layer is large, it is possible to increase the heat dissipation. Since the heat-dissipating layer is in contact with not only the top surface of the first electronic component, but also the portion of the side surface of the first electronic component, it is possible to increase the contact area between the first electronic component and the heat-dissipating layer. Consequently, it is possible to suppress the peeling of the first electronic component and the second electronic component from the substrate and to more efficiently dissipate the heat generated by the first electronic component.

The heat-dissipating layer may be made of a metal.

Therefore, since a metal having a thermal conductivity higher than the thermal conductivity of the insulating layer is used as the heat-dissipating layer, the heat dissipation can be made higher than the heat dissipation when the heat-dissipating layer is formed from the insulating layer. Since the heat-dissipating layer is made of a metal, it is possible to shield the high-frequency module from noise. By covering the portion of the side surface of the first electronic component with the metal that forms the heat-dissipating layer, it is possible to ensure the isolation in the high-frequency module and to improve the performance of the high-frequency module.

A top surface of the heat-dissipating layer may be flat.

Therefore, since the top surface of the high-frequency module is flat, it is possible to simplify the external shape of the high-frequency module.

An elastic modulus of the insulating layer may be less than an elastic modulus of the heat-dissipating layer.

Therefore, since the insulating layer is less likely to be deformed even if the heat-dissipating layer is deformed by heat, the insulating layer is less likely to peel from the substrate. Consequently, it is possible to suppress the peeling of the insulating layer from the substrate and to suppress the peeling of the first electronic component and the second electronic component from the substrate.

A thermal conductivity of the heat-dissipating layer may be greater than or equal to a thermal conductivity of the insulating layer.

Therefore, after the heat generated by the first electronic component has been conducted to the heat-dissipating layer, the heat is less likely to be conducted to the insulating layer from the heat-dissipating layer. Consequently, it is possible to dissipate the heat generated by the first electronic component without the heat stagnating in the high-frequency module.

A heat-generating ability of the first electronic component may be higher than a heat-generating ability of the second electronic component.

Therefore, by using a structure in which the top surface and the portion of the side surface of the first electronic component having a high heat-generating ability are in contact with the heat-dissipating layer, it is possible to efficiently dissipate the heat generated by the first electronic component.

The first electronic component may be a power amplifier.

Therefore, by using a structure in which, of the electronic components of the high-frequency module, the top surface and the portion of the side surface of the power amplifier having a high heat-generating ability are in contact with the heat-dissipating layer, it is possible to efficiently dissipate the heat generated by the first electronic component.

The first electronic component may be a duplexer.

Therefore, by using a structure in which, of the electronic components of the high-frequency module, the top surface and the portion of the side surface of the duplexer having a high heat-generating ability are in contact with the heat-dissipating layer, it is possible to efficiently dissipate the heat generated by the first electronic component.

The top surface of the first electronic component may be located at a greater distance than the top surface of the second electronic component from a surface of the substrate.

Therefore, it is possible to bring only the first electronic component into contact with the heat-dissipating layer and to seal the second electronic component by the insulating layer.

The high-frequency module may further include a ground conductor provided in the substrate, and the heat-dissipating layer may be connected to the ground conductor.

Therefore, since it is possible to set the heat-dissipating layer at ground potential, it is possible to use the heat-dissipating layer to efficiently shield the first electronic component and the second electronic component of the high-frequency module from noise caused by, for example, an external magnetic field.

According to the present disclosure, it is possible to provide a high-frequency module that is capable of suppressing peeling of an electronic component from the substrate.

DETAILED DESCRIPTION OF THE DISCLOSURE

Figure 1:
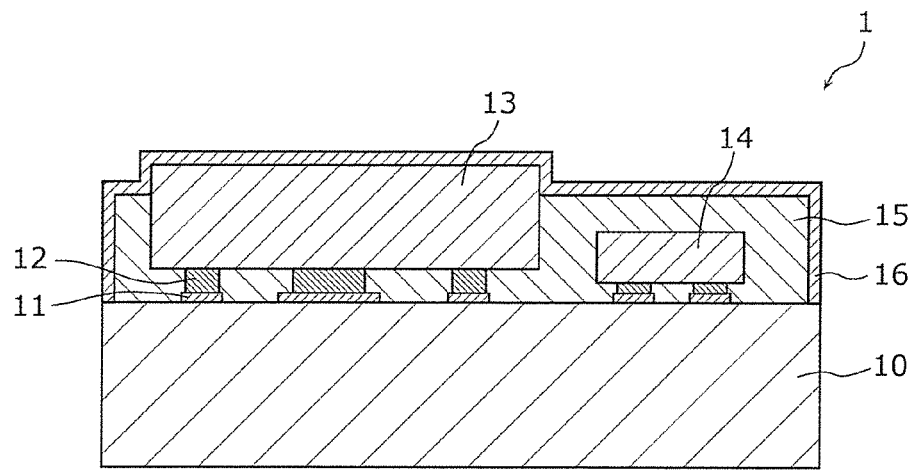
FIG. 1 is a sectional view of a structure of a high-frequency module according to a first embodiment.

Embodiments of the present disclosure are described below. The embodiments that are described below are preferred illustrative embodiments of the present disclosure. Therefore, for example, the numerical values, shapes, materials, structural elements, and arrangements and connection forms of the structural elements, which are mentioned in the embodiments below, are exemplifications and are not intended to limit the present disclosure. Therefore, of the structural elements in the embodiments below, structural elements that are not described in the independent claim that indicates the most generic concept of the present disclosure are described as optional structural elements.

The figures are schematic views and are not necessarily exact. In each figure, structures that are substantially the same are given the same reference numerals, and the same descriptions are not given or are simplified.

First Embodiment

A first embodiment is described below by using FIG. 1.

First, a structure of a high-frequency module 1 according to the present embodiment is described. FIG. 1 is a conceptual view of the structure of the high-frequency module 1 according to the present embodiment.

As shown in FIG. 1, the high-frequency module 1 includes a substrate 10, a first electronic component 13, a second electronic component 14, an insulating layer 15, and a heat-dissipating layer 16.

The substrate 10 is formed from, for example, a multilayer ceramic. A wiring pattern (not shown) and pads 11 that are connected to the wiring pattern and that are for joining the first electronic component 13 and the second electronic component 14 to the wiring pattern are formed on the substrate 10. The wiring pattern and the pads 11 are formed, for example, by patterning in accordance with a predetermined pattern by using a metal, such as copper.

The first electronic component 13 and the second electronic component 14 are mounted on the substrate 10. It is desirable that the first electronic component 13 be a component that dissipates the heat because the first electronic component 13 has a heat-generating ability that is higher than the heat-generating ability of the second electronic component 14 described later and generates the heat due to the use of the high-frequency module 1. The first electronic component 13 is, for example, a power amplifier (PA) or a duplexer (DPX). The second electronic component 14 is, for example, a component having a small heat-generation amount, such as a chip inductor, a chip capacitor, or a switch. The height of the first electronic component 13 is greater than the height of the second electronic component 14. That is, a top surface of the first electronic component 13 is located at a greater distance than a top surface of the second electronic component 14 from a surface of the substrate 10.

The first electronic component 13 and the second electronic component 14 are joined to the pads 11 via bumps 12, the pads 11 being formed on the substrate 10. The first electronic component 13 and the second electronic component 14 may be mounted to the substrate 10 by other methods instead of by the method of joining the first electronic component 13 and the second electronic component 14 to the pads 11 via the bumps 12.

The insulating layer 15 is a resin layer for sealing or fixing the first electronic component 13 and the second electronic component 14 to the substrate 10. The insulating layer 15 is made of, for example, an epoxy-based resin. Specifically, the insulating layer 15 covers a part of each side surface of the first electronic component 13, and the side surfaces and the top surface of the second electronic component 14. The insulating layer 15 is formed, for example, by applying a liquid epoxy-based resin at a thickness that is less than the height of the top surface of the electronic component 13 mounted on the substrate 10 and that is greater than the height of the top surface of the second electronic component 14 and by curing the epoxy-based resin with heat or ultraviolet light. Therefore, the insulating layer 15 is formed at a thickness that is less than the height of the top surface of the first electronic component 13 and that is greater than the height of the top surface of the second electronic component 14. Consequently, as shown in FIG. 1, a step is formed between the top surface of the first electronic component 13 and a top surface of the insulating layer 15. The second electronic component 14 is sealed by the insulating layer 15.

The material of the insulating layer 15 is not limited to an epoxy-based resin. The insulating layer 15 may be made of the other types of resin. For example, the insulating layer 15 may be made of an aramid-based resin or a phenol-based resin. The material of the insulating layer 15 is not limited to a resin and may be the other types of materials as long as such materials are insulating materials.

The heat-dissipating layer 16 is a heat-dissipating layer for dissipating the heat that is generated from the first electronic component 13. The heat-dissipating layer 16 is made of a material having a high thermal conductivity, for example, a metal, such as silver. For example, the heat-dissipating layer 16 is formed in the form of a thin film with a uniform thickness onto the first electronic component 13 and onto the insulating layer 15 by, for example, sputtering. The thickness of the heat-dissipating layer 16 is, for example, 5 μm to 10 μm.

As described above, the insulating layer 15 covers the part of each side surface of the first electronic component 13, and the side surfaces and the top surface of the second electronic component 14. The top surface and a portion of each side surface of the first electronic component 13 are not covered by the insulating layer 15. Therefore, by forming the heat-dissipating layer 16 by, for example, sputtering, the heat-dissipating layer 16 is disposed on the top surface of the first electronic component 13, a portion of each side surface of the first electronic component 13 excluding the above-described part of each side surface of the first electronic component 13 in contact with the insulating layer 15, and the top surface and side surfaces of the insulating layer 15. That is, the top surface and the portion of each side surface of the first electronic component 13 are in contact with the heat-dissipating layer 16. Therefore, in the high-frequency module 1, since the part of each side surface of the first electronic component 13 and the side surfaces and the top surface of the second electronic component 14 are covered by the insulating layer 15, it is possible to suppress the peeling of the first electronic component 13 and the second electronic component 14 from the substrate 10. Since the heat-dissipating layer 16 is in contact with not only the top surface of the first electronic component 13, but also the portion of each side surface of the first electronic component 13, it is possible to increase the contact area between the first electronic component 13 and the heat-dissipating layer 16. Consequently, it is possible to more efficiently dissipate the heat generated by the first electronic component 13.

Since the heat-dissipating layer 16 is made of a metal, in the high-frequency module 1, it is possible to shield the first electronic component 13 and the second electronic component 14, which are covered by the heat-dissipating layer 16, from the noise caused by, for example, an external magnetic field. At this time, the heat-dissipating layer 16 is also disposed on the side surfaces of the insulating layer 15 and covers the entire insulating layer 15. Since the heat-dissipating layer 16 is in contact with the substrate 10, when the substrate 10 is connected to ground, it is possible to set the heat-dissipating layer 16 at ground potential. Therefore, this structure is capable of further increasing a shielding effect.

Further, the heat-dissipating layer 16 made of a metal covers the portion of each side surface of the first electronic component 13. Therefore, it is possible to ensure the isolation in the high-frequency module 1 and to improve the performance of the high-frequency module 1. When the heights at which the side surfaces of the first electronic component 13 are covered by the heat-dissipating layer 16 are increased, it is possible to improve the isolation characteristics of the high-frequency module 1 and to improve the performance of the high-frequency module 1 even more. For example, when the first electronic component 13 is an amplifier circuit, it is possible to efficiently intercept a harmonic component that is generated from the amplifier circuit.

The thermal conductivity of the heat-dissipating layer 16 is greater than or equal to the thermal conductivity of the insulating layer 15. Therefore, after the heat generated by the first electronic component 13 has been conducted to the heat-dissipating layer 16, the heat is less likely to be conducted to the insulating layer 15 from the heat-dissipating layer 16. Consequently, it is possible to dissipate the heat generated by the first electronic component 13 without the heat stagnating in the high-frequency module 1.

The elastic modulus of the insulating layer 15 is less than the elastic modulus of the heat-dissipating layer 16. That is, since the insulating layer 15 is made of a material through which the vibration caused by the external physical impact is less likely to be transmitted than through the heat-dissipating layer 16, the insulating layer 15 is less likely to peel from the substrate 10. Therefore, it is possible to suppress the peeling of the insulating layer 15 from the substrate 10 and to reduce the stress that the insulating layer 15 applies to the bumps 12. Consequently, it is possible to suppress the peeling of the first electronic component 13 and the second electronic component 14 from the substrate 10 occurring when the bumps 12 are peeled from the pads 11 due to the peeling of the insulating layer 15.

The material of the heat-dissipating layer 16 is not limited to a metal. Any material may be used as long as the material has a thermal conductivity that is higher than the thermal conductivity of the insulating layer 15 and an elastic modulus that is higher than the elastic modulus of the insulating layer 15. Although the heat-dissipating layer 16 is formed on the top surface and the side surfaces of the insulating layer 15, the heat-dissipating layer 16 may also be formed on the side surfaces of the substrate 10 continuously from the side surfaces of the insulating layer 15.

The high-frequency module 1 according to the present embodiment is capable of efficiently dissipating the heat generated by the first electronic component 13. Since the heat-dissipating layer 16 is in contact with not only the top surface of the first electronic component, but also the portion of each side surface of the first electronic component, it is possible to increase the contact area between the first electronic component 13 and the heat-dissipating layer 16. Consequently, it is possible to more efficiently dissipate the heat generated by the first electronic component 13.

Since the heat-dissipating layer 16 is made of a metal, in the high-frequency module 1, it is possible to shield the first electronic component 13 and the second electronic component 14 that are covered by the heat-dissipating layer 16 from noise caused by, for example, an external magnetic field.

Second Embodiment

Figure 2:
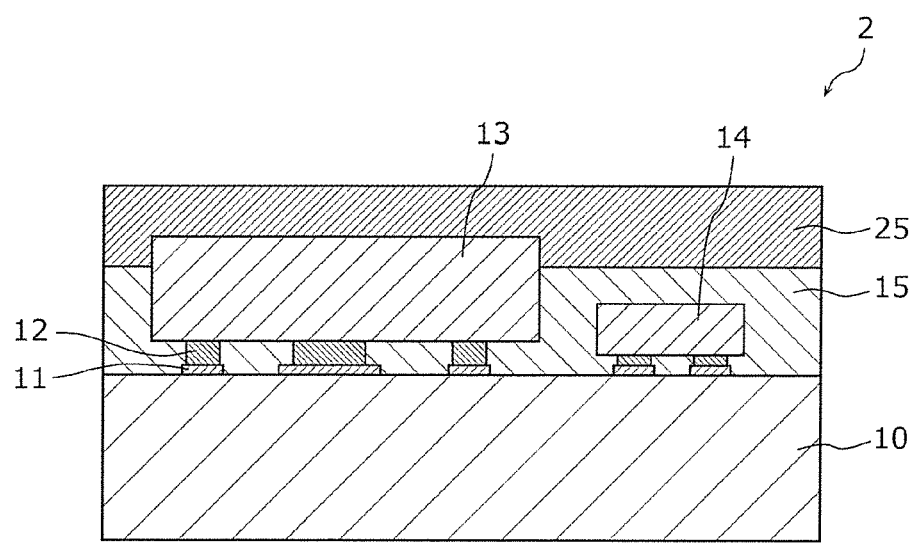
FIG. 2 is a sectional view of a structure of a high-frequency module according to a second embodiment.

Next, a second embodiment is described by using FIG. 2. FIG. 2 is a conceptual view of a structure of a high-frequency module 2 according to the present embodiment.

The high-frequency module 2 according to the present embodiment differs from the high-frequency module 1 according to the first embodiment in that the high-frequency module 2 includes a heat-dissipating layer 25.

As shown in FIG. 2, the high-frequency module 2 includes a substrate 10, a first electronic component 13, a second electronic component 14, an insulating layer 15, and the heat-dissipating layer 25. Since the substrate 10, the first electronic component 13, the second electronic component 14, and the insulating layer 15 are the same as the substrate 10, the first electronic component 13, the second electronic component 14, and the insulating layer 15 in the first embodiment, the descriptions thereof are not given.

Similarly to the heat-dissipating layer 15, the heat-dissipating layer 25 is made of, for example, an epoxy-based resin. The heat-dissipating layer 25 is made of a resin having a thermal conductivity that is greater than or equal to the thermal conductivity of the insulating layer 15. The material of the heat-dissipating layer 25 is not limited to an epoxy-based resin. The heat-dissipating layer 25 may be made of the other type of resin, such as an aramid-based resin or a phenol-based resin, or other types of materials.

Here, as shown in FIG. 2, the heat-dissipating layer 25 is disposed on a top surface and a portion of each side surface of the first electronic component 13, and a top surface and side surfaces of the insulating layer 15. That is, the top surface of the first electronic component 13 and the portion of each side surface of the first electronic component 13 excluding the part of each side surface of the first electronic component 13 in contact with the insulating layer 15 are in contact with the heat-dissipating layer 25. Therefore, in the high-frequency module 2, it is possible to efficiently dissipate the heat generated by the first electronic component 13 via the heat-dissipating layer 25. Since the heat-dissipating layer 25 is in contact with not only the top surface of the first electronic component 13, but also the portion of each side surface of the first electronic component 13, it is possible to increase the contact area between the first electronic component 13 and the heat-dissipating layer 25. Consequently, it is possible to more efficiently dissipate the heat generated by the first electronic component 13.

The heat-dissipating layer 25 is formed on the insulating layer 15 and the first electronic component 13 so as to eliminate a step formed by the top surface of the first electronic component 13 and the top surface of the insulating layer 15. Similarly to the insulating layer 15, the heat-dissipating layer 25 is formed, for example, by applying a liquid epoxy-based resin to the insulating layer 15 and by curing the epoxy-based resin with heat or ultraviolet light. Therefore, a top surface of the heat-dissipating layer 25 is flat.

According to the high-frequency module 2 according to the present embodiment, since a part of each side surface of the first electronic component 13, and each side surface and a top surface of the second electronic component 14 are covered by the insulating layer 15, it is possible to suppress the peeling of the first electronic component 13 and the second electronic component 14 from the substrate 10. Since the heat-dissipating layer 25 is in contact with not only the top surface of the first electronic component 13, but also the portion of each side surface of the first electronic component 13, it is possible to increase the contact area between the first electronic component 13 and the heat-dissipating layer 25. Consequently, it is possible to suppress the peeling of the first electronic component 13 and the second electronic component 14 from the substrate 10 and to more efficiently dissipate the heat generated by the first electronic component. In addition, since the top surface of the heat-dissipating layer 25 can be made flat, it is possible to simplify the external shape of the high-frequency module 2.

The material of the heat-dissipating layer 25 is not limited to the aforementioned resin and may be other types of resins or other types of materials. The method of forming the heat-dissipating layer 25 is not limited to the above-described method and may be changed as appropriate in accordance with the material.

Third Embodiment

Figure 3:
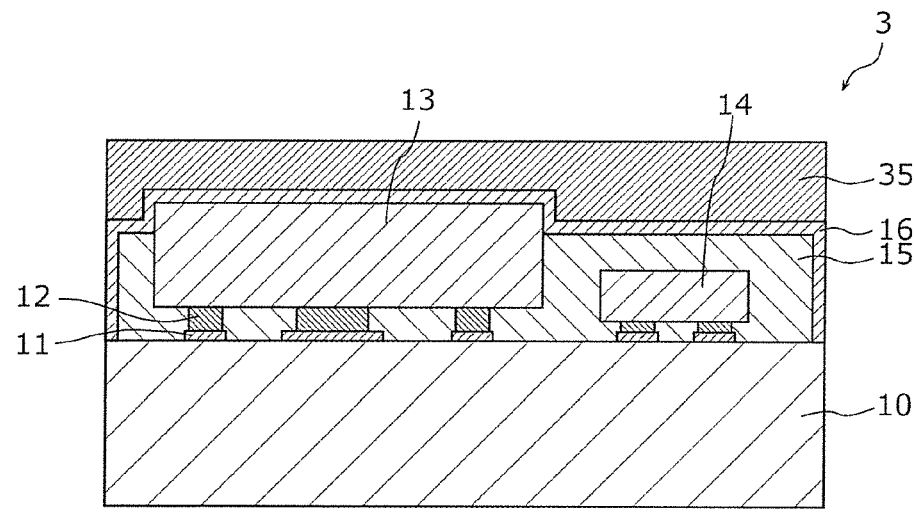
FIG. 3 is a sectional view of a structure of a high-frequency module according to a third embodiment.

Next, a third embodiment is described by using FIG. 3. FIG. 3 is a conceptual view of a structure of a high-frequency module 3 according to the present embodiment.

The high-frequency module 3 according to the present embodiment differs from the high-frequency module 1 according to the first embodiment in that a flat layer 35 is provided on a heat-dissipating layer 16.

As shown in FIG. 3, the high-frequency module 3 includes a substrate 10, a first electronic component 13, a second electronic component 14, an insulating layer 15, the heat-dissipating layer 16, and the flat layer 35. Since the substrate 10, the first electronic component 13, the second electronic component 14, the insulating layer 15, and the heat-dissipating layer 16 are the same as the substrate 10, the first electronic component 13, the second electronic component 14, the insulating layer 15, and the heat-dissipating layer 16 in the first embodiment, the descriptions thereof are not given.

The flat layer 35 is a layer for making a top surface of the high-frequency module 3 flat. Therefore, as shown in FIG. 3, the flat surface 35 is formed on the heat-dissipating layer 16 so as to eliminate a step formed by a top surface of the first electronic component 13 and a top surface of the insulating layer 15.

The flat layer 35 is not only a layer for making the top surface of the high-frequency module 3 flat, but may also be used as a heat-dissipating layer along with the heat-dissipating layer 16. That is, it is possible to conduct the heat generated by the first electronic component 13 to the heat-dissipating layer 16 and to further conduct the heat to the flat layer 35 that is in contact with the heat-dissipating layer 16 and dissipate the heat. For example, the heat may be dissipated from portions other than the flat layer 35 by connecting the heat-dissipating layer 16 to ground.

Similarly to the heat-dissipating layer 25 in the second embodiment, the flat layer 35 is made of, for example, an epoxy-based resin. Similarly to the heat-dissipating layer 25, the flat layer 35 is formed, for example, by applying a liquid epoxy-based resin to the insulating layer 15 and by curing the epoxy-based resin with heat or ultraviolet light. Therefore, a top surface of the flat layer 35 is flat.

The material of the flat layer 35 is not limited to an epoxy-based resin. The flat layer 35 may be made of other types of resin, such as an aramid-based resin or a phenol-based resin, or other types of materials. The flat layer 35 may be made of a resin having a thermal conductivity that is greater than or equal to the thermal conductivity of the insulating layer 15, or may be made of the same material as the insulating layer 15.

According to the high-frequency module 3 according to the present embodiment, since a part of each side surface of the first electronic component 13, and each side surface and a top surface of the second electronic component 14 are covered by the insulating layer 15, it is possible to suppress the peeling of the first electronic component 13 and the second electronic component 14 from the substrate 10. It is possible to more efficiently dissipate the heat generated by the first electronic component 13 by the heat-dissipating layer 16 or by the heat-dissipating layer 16 and the flat layer 35, and to make the top surface of the high-frequency module 3 flat.

The material of the flat layer 35 is not limited to the above-described resins. The flat layer 35 may be made of other types of resin or other types of materials. The method of forming the flat layer 35 is not limited to the above-described method and may be changed as appropriate in accordance with the material.

Fourth Embodiment

Figure 4:
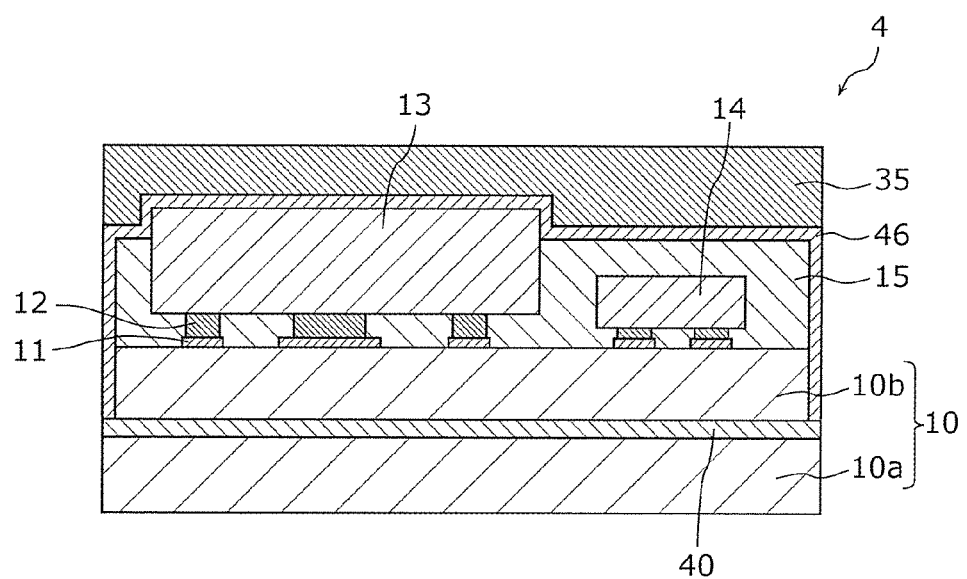
FIG. 4 is a sectional view of a structure of a high-frequency module according to a fourth embodiment.

Next, a fourth embodiment is described by using FIG. 4. FIG. 4 is a conceptual view of a structure of a high-frequency module 4 according to the present embodiment.

The high-frequency module 4 according to the present embodiment differs from the high-frequency module 1 according to the first embodiment in that a substrate 10 includes a ground conductor 40 in its interior and that a heat-dissipating layer 46 is connected to the ground conductor 40.

As shown in FIG. 4, the high-frequency module 4 includes the substrate 10, a first electronic component 13, a second electronic component 14, an insulating layer 15, the heat-dissipating layer 46, a flat layer 35, and the ground conductor 40. Since the first electronic component 13, the second electronic component 14, and the insulating layer 15 are the same as the first electronic component 13, the second electronic component 14, and the insulating layer 15 in the first embodiment, the descriptions thereof are not given.

The substrate 10 includes a first substrate 10a, the ground conductor 40 disposed on the first substrate 10a, and a second substrate 10b disposed on the first substrate 10a so as to seal the ground conductor 40.

The ground conductor 40 is formed on the first substrate 10a, for example, by patterning in accordance with a predetermined pattern by using a metal, such as copper. As shown in FIG. 4, end surfaces of the ground electrode 40 are exposed at corresponding side surfaces of the substrate 10b. The ground conductor 40 is connected to ground at the end surfaces exposed at the corresponding side surfaces of the substrate 10b or at other portions.

As shown in FIG. 4, in the high-frequency module 4, similarly to the heat-dissipating layer 16 in the first embodiment, for example, the heat-dissipating layer 46 is formed on the first electronic component 13 and the insulating layer 15 by, for example, sputtering. By forming the heat-dissipating layer 46 by, for example, sputtering, the heat-dissipating layer 46 is formed on a top surface of the first electronic component 13, a portion of each side surface of the first electronic component 13 excluding a part of each side surface of the first electronic component 13 in contact with the insulating layer 15, and a top surface and side surfaces of the insulating layer 15. Further, the heat-dissipating layer 46 is also formed on the side surfaces of the first substrate 10b and the end surfaces of the ground conductor 40 continuously from the side surfaces of the insulating layer 15. Therefore, since the heat-dissipating layer 46 is connected to the ground conductor 40, it is possible to set the heat-dissipating layer 46 at ground potential. Consequently, it is possible to realize a higher shielding effect.

Similarly to the heat-dissipating layer 16 in the first embodiment, since the heat-dissipating layer 46 is in contact with not only the top surface of the first electronic component 13, but also the portion of each side surface of the first electronic component 13, it is possible to increase the contact area between the first electronic component 13 and the heat-dissipating layer 46. Therefore, it is possible to more efficiently dissipate the heat generated by the first electronic component 13.

The high-frequency module 4 further includes the flat layer 35, which is similar to that of the high-frequency module 3 in the third embodiment, on the heat-dissipating layer 46. Since the structure of the flat layer 35 is the same as the structure of the flat layer 35 in the third embodiment, the description thereof is not given. Therefore, it is possible to form the entire top surface of the high-frequency module 4 into a flat surface.

According to the high-frequency module 4 of the present embodiment, since a part of each side surface of the first electronic component 13, and each side surface and a top surface of the second electronic component 14 are covered by the insulating layer 15, it is possible to suppress the peeling of the first electronic component 13 and the second electronic component 14 from the substrate 10. In addition, it is possible to more efficiently dissipate the heat generated by the first electronic component 13 and to realize a higher shielding effect by setting the heat-dissipating layer 46 at ground potential due to the heat-dissipating layer 46 being connected to the ground conductor 40.

Other Embodiments

The present disclosure is not limited to the structures in the above-described embodiments, and may be changed as appropriate as in, for example, the following modifications.

For example, the material of the heat-dissipating layer 16 and the material of the heat-dissipating layer 46 are not limited to the aforementioned silver. The heat-dissipating layers 16 and 46 may be made of other types of metal or other types of materials. The materials of the insulating layer 15, the heat-dissipating layer 25, and the flat layer 35 are not limited to the aforementioned epoxy-based resin. The insulating layer 15, the heat-dissipating layer 25, and the flat layer 35 may be made of other types of resin, such as an aramid-based resin or a phenol-based resin, or other types of materials. The method of forming the heat-dissipating layer 16, the heat-dissipating layer 46, the insulating layer 15, the heat-dissipating layer 25, and the flat layer 35 is not limited to the above-described method, and may be changed as appropriate in accordance with the material.

Although, in the above-described embodiments, a power amplifier or a duplexer, each having a high heat-generating ability, is described as being the first electronic component 13, the first electronic component 13 may be other types of heat-generating components. Although, in the above-described embodiments, for example, a chip inductor, a chip capacitor, or a switch, each having low heat-generating ability, is described as the second electronic component 14, the second electronic component 14 may be other types of electronic components.

The heat-dissipating layer 16 and the heat-dissipating layer 46 may have a structure that covers either one of the power amplifier and the duplexer, or a structure that covers both of the power amplifier and the duplexer.

Although the number of ground conductors 40 formed in the substrate 10 is one, a plurality of such ground conductors 40 may be formed.

The present disclosure also includes forms acquired by variously modifying the above-described embodiments as such modifications come to the mind of a person having ordinary skill in the art, and forms realized by arbitrarily combining the structural elements and functions in the above-described embodiments within a scope that does not depart from the spirit of the present disclosure.

The present disclosure makes it possible to use, for example, a high-frequency module or a transmitting device, each including a heat-generating component, such as a power amplifier or a duplexer.

1, 2, 3, 4 high-frequency module
10 substrate
10a first substrate (substrate)
10b second substrate (substrate)
11 pad
12 bump
13 first electronic component
14 second electronic component
15 insulating layer
16, 25, 46 heat-dissipating layer 40 ground conductor
35 flat layer (heat-dissipating layer)

The invention claimed is:

1. A high-frequency module comprising:
a substrate;
a first electronic component and a second electronic component each provided on the substrate;
an insulating layer covering a one part of a side surface of the first electronic component, and a side surface and a top surface of the second electronic component;
a heat-dissipating layer covering at least a top surface of the first electronic component and a remaining part of the side surface of the first electronic component excluding the one part of the side surface of the first electronic component; and
a flat layer provided on the heat-dissipating layer making a top surface of the high-frequency module flat,
wherein a thermal conductivity of the flat layer is greater than or equal to a thermal conductivity of the insulating layer,
wherein heat-generating ability of the first electronic component is higher than a heat-generating ability of the second electronic component, and
wherein the first electronic component is a power amplifier or a duplexer.

2. The high-frequency module according to claim 1, wherein the heat-dissipating layer comprises a metal.

3. The high-frequency module according to claim 2, wherein the heat-dissipating layer covers the top surface of the first electronic component, the remaining part of the side surface of the first electronic component excluding the one part of the side surface, and a top surface of the insulating layer,
wherein a step is provided at a top surface of the heat-dissipating layer due to a difference between a height of the top surface of the first electronic component and a height of the top surface of the insulating layer.

4. The high-frequency module according to claim 2, wherein an elastic modulus of the insulating layer is less than an elastic modulus of the heat-dissipating layer.

5. The high-frequency module according to claim 2, wherein a thermal conductivity of the heat-dissipating layer is greater than or equal to a thermal conductivity of the insulating layer.

6. The high-frequency module according to claim 1, wherein the heat-dissipating layer covers the top surface of the first electronic component, the remaining part of the side surface of the first electronic component excluding the one part of the side surface, and a top surface of the insulating layer,
wherein a step is provided at a top surface of the heat-dissipating layer due to a difference between a height of the top surface of the first electronic component and a height of the top surface of the insulating layer.

7. The high-frequency module according to claim 6, wherein an elastic modulus of the insulating layer is less than an elastic modulus of the heat-dissipating layer.

8. The high-frequency module according to claim 6, wherein a thermal conductivity of the heat-dissipating layer is greater than or equal to a thermal conductivity of the insulating layer.

9. The high-frequency module according to claim 1, wherein an elastic modulus of the insulating layer is less than an elastic modulus of the heat-dissipating layer.

10. The high-frequency module according to claim 1, wherein a thermal conductivity of the heat-dissipating layer is greater than or equal to a thermal conductivity of the insulating layer.

11. The high-frequency module according to claim 1, further comprising:
a ground conductor provided in the substrate,
wherein the heat-dissipating layer is connected to the ground conductor.

12. The high-frequency module according to claim 1, wherein the heat-dissipating layer is disposed on and extends along part of the side surface of the first electronic component.

13. A high-frequency module comprising:
a substrate;
a first electronic component and a second electronic component each provided on the substrate;
an insulating layer covering a one part of a side surface of the first electronic component, and a side surface and a top surface of the second electronic component; and
a heat-dissipating layer covering at least a top surface of the first electronic component and a remaining part of the side surface of the first electronic component excluding the one part of the side surface of the first electronic component,
wherein a top surface of the heat-dissipating layer is flat and extends over the first electronic component and the second electronic component.

14. The high-frequency module according to claim 13, wherein an elastic modulus of the insulating layer is less than an elastic modulus of the heat-dissipating layer.

15. The high-frequency module according to claim 13, wherein a thermal conductivity of the heat-dissipating layer is greater than or equal to a thermal conductivity of the insulating layer.

16. A high-frequency module comprising:
a substrate;
a first electronic component and a second electronic component each provided on the substrate;
an insulating layer covering a one part of a side surface of the first electronic component, and a side surface and a top surface of the second electronic component;
a heat-dissipating layer covering at least a top surface of the first electronic component and a remaining part of the side surface of the first electronic component excluding the one part of the side surface of the first electronic component; and
a flat layer provided on the heat-dissipating layer making a top surface of the high-frequency module flat,
wherein a thermal conductivity of the flat layer is greater than or equal to a thermal conductivity of the insulating layer,
wherein the top surface of the first electronic component is located at a greater distance than the top surface of the second electronic component from a surface of the substrate, and
wherein the first electronic component is a power amplifier or a duplexer.

* * * * *